(12) United States Patent
Kim et al.

(10) Patent No.: US 9,224,787 B2
(45) Date of Patent: Dec. 29, 2015

(54) METHOD FOR FABRICATING NONVOLATILE MEMORY DEVICE

(71) Applicants: Whan-Kyun Kim, Seoul (KR); Young-Hyun Kim, Seoul (KR); Woo-Jin Kim, Yongin-si (KR)

(72) Inventors: Whan-Kyun Kim, Seoul (KR); Young-Hyun Kim, Seoul (KR); Woo-Jin Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/193,877

(22) Filed: Feb. 28, 2014

(65) Prior Publication Data

US 2014/0256062 A1  Sep. 11, 2014

(30) Foreign Application Priority Data

Mar. 6, 2013  (KR) .................. 10-2013-0024115

(51) Int. Cl.
*H01L 21/00* (2006.01)
*H01L 27/22* (2006.01)
*H01L 43/12* (2006.01)

(52) U.S. Cl.
CPC ............. *H01L 27/228* (2013.01); *H01L 43/12* (2013.01)

(58) Field of Classification Search
CPC ................ H01L 27/0805; H01L 27/10808
USPC .............. 438/3, 239, 341, 253, 254, 396, 397
See application file for complete search history.

(56) References Cited

U.S. PATENT DOCUMENTS

| | | | |
|---|---|---|---|
| 6,196,155 B1 | 3/2001 | Setoyama et al. | |
| 6,783,994 B2 | 8/2004 | Rizzo et al. | |
| 7,159,537 B2 | 1/2007 | Wickramanayaka et al. | |
| 8,231,767 B2 | 7/2012 | Iori et al. | |
| 2002/0106856 A1* | 8/2002 | Lee et al. | 438/255 |
| 2003/0228733 A1* | 12/2003 | Itoh et al. | 438/240 |
| 2007/0148896 A1* | 6/2007 | Nakamura et al. | 438/381 |
| 2010/0294656 A1 | 11/2010 | Ikeda et al. | |
| 2011/0233696 A1 | 9/2011 | Li | |
| 2011/0259733 A1 | 10/2011 | Watanabe et al. | |
| 2011/0272770 A1 | 11/2011 | Hatada | |
| 2012/0161322 A1 | 6/2012 | Wakayanagi et al. | |

FOREIGN PATENT DOCUMENTS

| | | |
|---|---|---|
| JP | 2003-318165 | 11/2003 |
| JP | 2007-221149 | 8/2007 |
| JP | 2008-226987 | 9/2008 |
| JP | 2011-017088 | 1/2011 |
| KR | 10-2010-0018814 A | 2/2010 |

* cited by examiner

*Primary Examiner* — Brook Kebede
(74) *Attorney, Agent, or Firm* — Myers Bigel Sibley & Sajovec, PA

(57) ABSTRACT

A method for fabricating a nonvolatile memory device is provided. The method includes forming a transistor including an impurity region formed in a substrate, forming a first interlayer insulation layer covering the transistor, the first interlayer insulation layer including a protrusion overlapping the impurity region, and forming an information storage unit on the protrusion, the information storage unit exposing side surfaces of the protrusion using point cusp magnetron-physical vapor deposition (PCM-PVD) and electrically connected to the impurity region.

10 Claims, 12 Drawing Sheets

METHOD FOR FABRICATING NONVOLATILE MEMORY DEVICE

CROSS-REFERENCE TO RELATED APPLICATION

This application claims priority from Korean Patent Application No. 10-2013-0024115 filed on Mar. 6, 2013 in the Korean Intellectual Property Office, and all the benefits accruing therefrom under 35 U.S.C. 119, the contents of which in its entirety are herein incorporated by reference.

FIELD

The present invention relates to a method of fabricating a nonvolatile memory device.

BACKGROUND

Nonvolatile memories using resistance materials include phase-change random access memories (PRAMs), resistive RAMs (RRAMs), and magnetic RAMs (MRAMs). While dynamic RAMs (DRAMs) or flash memories store data using charge, nonvolatile memories using resistance materials store data using a state change of a phase-change material, such as a chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

Semiconductor products may need to process high capacity data while they are gradually becoming more compact. Accordingly, there is demand for increasing the operating speed and integration level of memory devices used in such semiconductor products. To meet such demand, there have been proposed magnetic memory devices implementing memory functions using a resistance change depending on a change in the polarity of a magnetic material, and various studies of the magnetic memory devices are being conducted.

SUMMARY

The present invention provides a method of fabricating a nonvolatile memory device, which forms a magnetic tunnel junction (MTJ) on a top surface of a lower electrode terminal patterned in a three-dimensional pillar shape using point cusp magnetron-physical vapor deposition (PCM-PVD).

The above and other objects of the present invention will be described in or be apparent from the following description of the embodiments.

According to an aspect of the present invention, there is provided a method of fabricating a nonvolatile memory device, the method including forming a transistor including an impurity region formed in a substrate, forming a first interlayer insulation layer covering the transistor, the first interlayer insulation layer including a protrusion overlapping the impurity region, and forming an information storage unit on the protrusion, the information storage unit exposing side surfaces of the protrusion using point cusp magnetron-physical vapor deposition (PCM-PVD) and electrically connected to the impurity region.

According to another aspect of the present invention, there is provided a method of fabricating a nonvolatile memory device, the method including forming a transistor including an impurity region formed in a substrate, forming a lower contact electrically connected to the impurity region, forming a first interlayer insulation layer on the lower contact, forming a first trench and a second trench in the first interlayer insulation layer, the first trench extending in a first direction and the second trench extending in a second direction different from the first direction, and forming an information storage unit electrically connected to the lower contact on a top surface of the first interlayer insulation layer using point cusp magnetron-physical vapor deposition (PCM-PVD) and forming a dummy information storage unit on bottom surfaces of the first and second trenches.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE EMBODIMENTS

Figure 1:
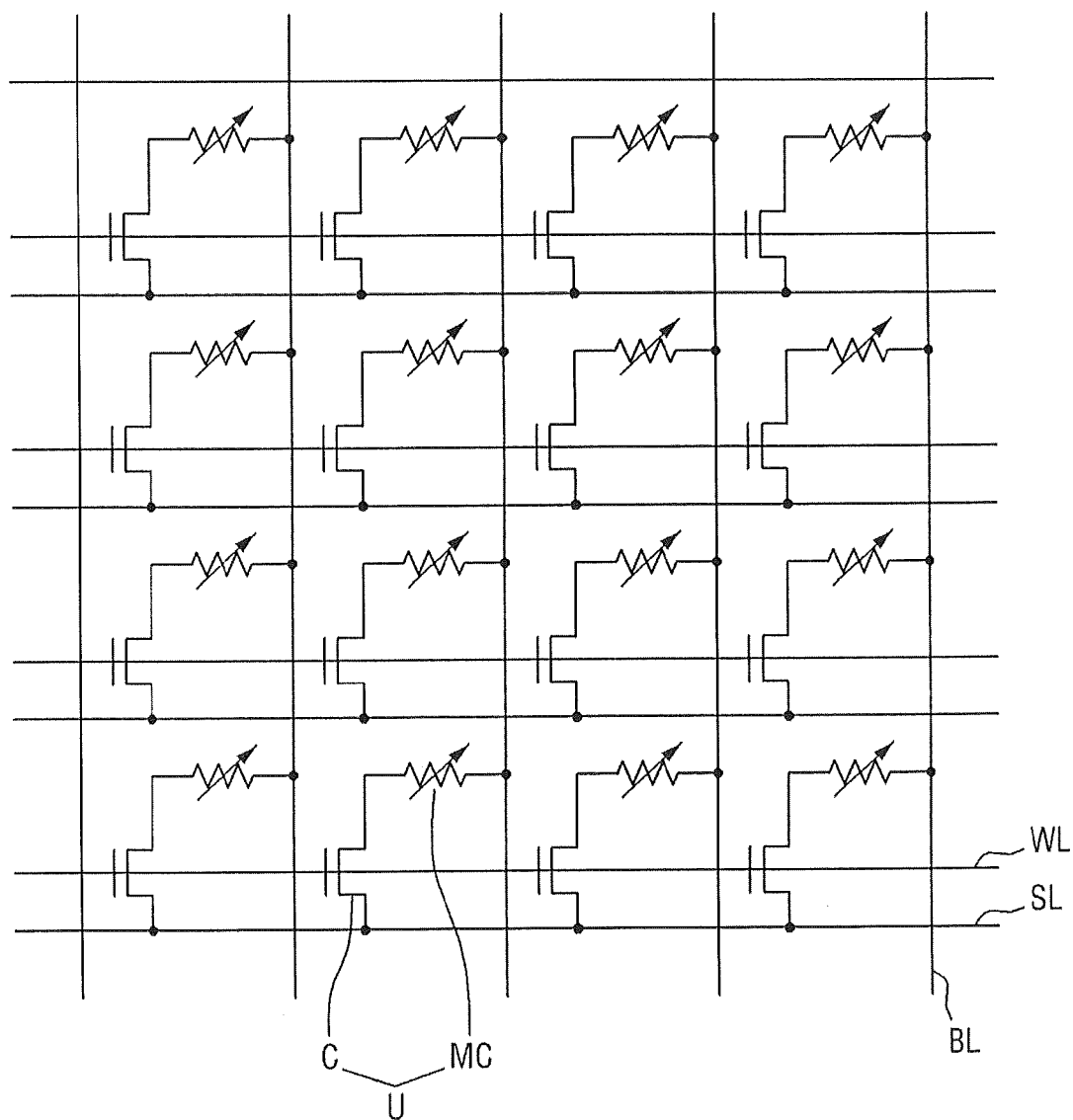
FIG. 1 is an equivalent circuit view illustrating a nonvolatile memory device fabricated according to embodiments of the present inventive subject matter.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
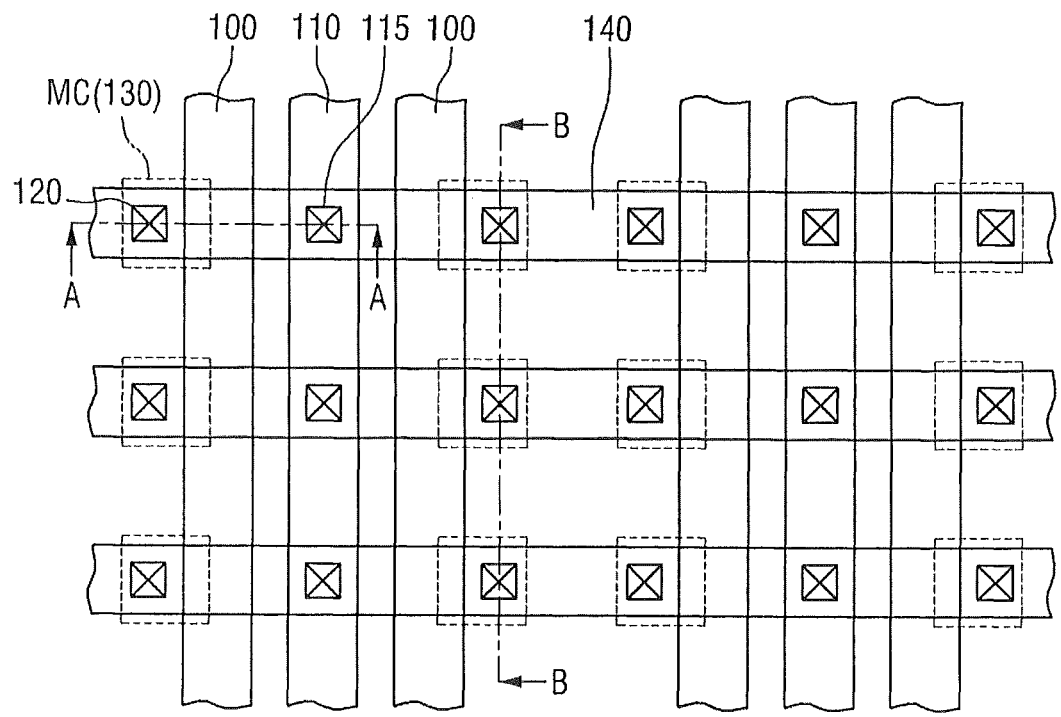
FIG. 2 is a layout view illustrating the nonvolatile memory device shown in FIG. 1.

FIG. 1 is an equivalent circuit view for explaining a nonvolatile memory device fabricated according to embodiments of the present inventive subject matter, and FIG. 2 is a layout view illustrating the nonvolatile memory device shown in FIG. 1.

Referring to FIG. 1, a magnetic memory array includes unit cells U of a plurality of magnetic memory devices arrayed in a matrix configuration. Each of the unit cells U of the plurality of magnetic memory devices includes an access part C and a memory cell MC. The unit cells U of the plurality of magnetic memory devices are electrically connected to word lines WL and bit lines BL. In addition, as shown in FIG. 1, when the access part C is a transistor, a source line SL may further be formed to be electrically connected to a source region of the access part C. While FIG. 1 shows that one access part C is connected to one source line SL, a plurality of access parts C may be connected to one source line SL. The word lines WL and bit lines BL may be arranged in a two-dimensional manner at a predetermined angle, for example, at a right angle. Alternatively, the word lines WL and bit lines BL may be arranged at a predetermined angle with respect to each other, for example, to be parallel with each other.

The access part C controls current supply to the memory cell MC according to the voltage of the word line WL. The access part C may be a MOS transistor, a bipolar transistor or a diode.

The memory cell MC may include a magnetic material or a magnetic tunnel junction (MTJ). In addition, the memory cell MC may perform a memory function using a spin transfer torque (STT) phenomenon in which a magnetization direction of the magnetic material varies according to the current input thereto.

Referring to FIG. 2, the transistor 100 is formed to extend lengthwise in a second direction DR2. A gate electrode included in the transistor 100 may function as, for example, the word line shown in FIG. 1. A first wiring 110 may be formed between neighboring transistors 100 extending lengthwise in the second direction DR2. The first wiring 110 is electrically connected to a common source/drain disposed between neighboring transistors 100 by a first contact 115. The first wiring 110 may be, for example, the source line SL shown in FIG. 1.

In the neighboring transistors, an information storage unit 130 is formed on a source/drain that is not electrically connected to the first wiring 110. The information storage unit 130 is electrically connected to the source/drain that is not electrically connected to the first wiring 110 by means of the second contact 120.

The second wiring 140 is formed to extend lengthwise in a first direction DR1. The second wiring 140 is formed to cross the transistor 100 and the first wiring 110. The second wiring 140 may be, for example, the bit line shown in FIG. 1. The second wiring 140 is electrically connected to a plurality of information storage units 130 arranged in the first direction DR1.

In the following description, the method for fabricating a nonvolatile memory device will be described in view of cross sections taken along the lines A-A and B-B.

An information storage unit in a method for fabricating a nonvolatile memory device according to embodiments of the present inventive subject matter will be described with reference to FIGS. 3A and 3B.

Figure 3A:
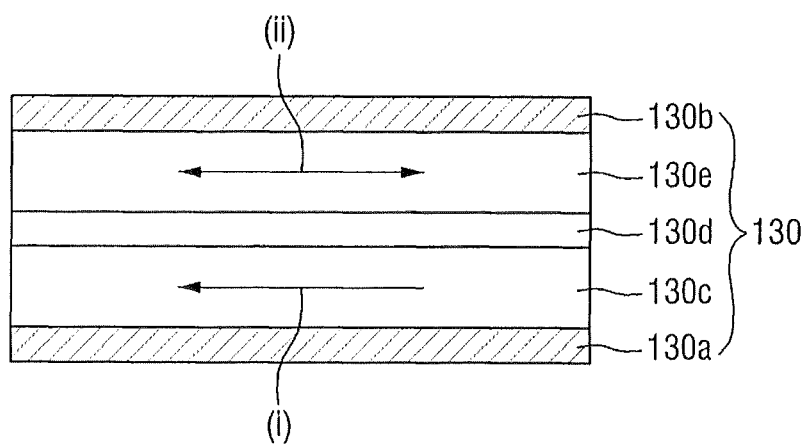
FIG. 3A is a cross-sectional view illustrating an example of an information storage unit in a method for fabricating a nonvolatile memory device according to embodiments of the present inventive subject matter.
Figure 3B:
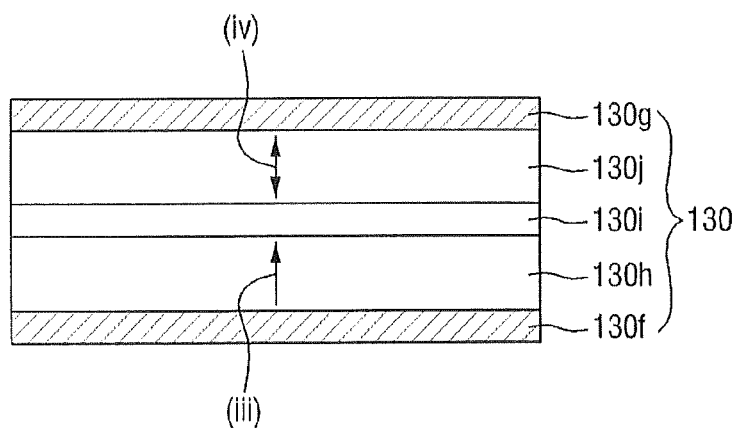
FIG. 3B is a cross-sectional view illustrating another example of an information storage unit in a method for fabricating a nonvolatile memory device according to embodiments of the present inventive subject matter.

FIG. 3A is a cross-sectional view illustrating an example of an information storage unit in a method for fabricating a nonvolatile memory device according to embodiments of the present inventive subject matter, and FIG. 3B is a cross-sectional view illustrating another example of an information storage unit in a method for fabricating a nonvolatile memory device according to embodiments of the present inventive subject matter.

Referring to FIG. 3A, the information storage unit 130 according to the embodiment of the present inventive subject matter may include a reference pattern 130c, a free pattern 130e, and a tunnel barrier pattern 130d disposed between the reference pattern 130c and the free pattern 130e. The reference pattern 130c has a magnetization direction (i) pinned in one direction, and the free pattern 130e has a magnetization direction (ii) variable to be parallel to or anti-parallel to the magnetization direction (i) of the reference pattern 130c. The magnetization directions i and ii of the reference pattern 130c and the free pattern 130e may be parallel to one surface of the tunnel barrier pattern 130d making contact with the free pattern 130e. The reference pattern 130c, the tunnel barrier pattern 130d and the free pattern 130e may constitute a magnetic tunnel junction (MTJ).

If the magnetization direction (ii) of the free pattern 130e is parallel to the magnetization direction (i) of the reference pattern 130c, the information storage unit 130 may have a first resistance value. If the magnetization direction (ii) of the free pattern 130e is anti-parallel to the magnetization direction (i) of the reference pattern 130c, the information storage unit 130 may have a second resistance value. Here, the first resistance value may be less than the second resistance value. The information storage unit 130 may store logic data using a difference between the first and second resistance values. The magnetization direction (ii) of the free pattern 130e may be changed by spin torque of electrons in program current.

The reference pattern 130c and the free pattern 130e may include a ferromagnetic material. The reference pattern 130c may further include an anti-ferromagnetic material pinning a magnetization direction of the ferromagnetic material in the reference pattern 130c. The tunnel barrier pattern 130d may include, for example, at least one of magnesium oxide, titanium oxide, aluminum oxide, magnesium-zinc oxide and magnesium-boron oxide.

The information storage unit 130 may further include a lower electrode 130a and an upper electrode 130b. The reference pattern 130c, the tunnel barrier pattern 130d and the free pattern 130e may be disposed between the lower electrode 130a and the upper electrode 130b. As shown in FIG. 3A, the reference pattern 130c, the tunnel barrier pattern 130d and the free pattern 130e may be, sequentially disposed on the lower electrode 130a, and the upper electrode 130b may be disposed on the free pattern 130e. Alternatively, the free pattern 130e, the tunnel barrier pattern 130d, and the reference pattern 130c may be sequentially disposed on the lower electrode 130a. The lower electrode 130a and the upper electrode 130b may include, for example, a conductive metal nitride, such as titanium nitride, tantalum nitride, or tungsten nitride.

Referring to FIG. 3B, the information storage unit 130 according to an embodiment of the present inventive subject matter may include a reference vertical pattern 130h, a free vertical pattern 130, and a tunnel barrier pattern 130i interposed between the reference vertical pattern 130h and the free vertical pattern 130. The reference vertical pattern 130h may have a magnetization direction (iii) pinned in one direction, and the free vertical pattern 130 may have a magnetization direction (iv) variable to be parallel to or anti-parallel to the magnetization direction (iii) of the reference vertical pattern 130h. Here, the magnetization directions (iii) and (iv) of the reference and free vertical patterns 130h and 130j may be substantially perpendicular to one surface of the tunnel barrier pattern 130i making contact with the free vertical pattern 130.

The reference vertical pattern 130h and the free vertical pattern 130 may include, for example, at least one of a vertical magnetic material such as CoFeTb, CoFeGd, or CoFeDy, a vertical magnetic material having an L10 structure, CoPt having a hexagonal close packed lattice, and a vertical magnetic structure. The vertical magnetic material having an L10 structure may include, for example, at least one of L10 ordered FePt, L10 ordered FePd, L10 ordered CoPd, and L10 ordered CoPt. The vertical magnetic structure may include magnetic layers and non-magnetic layers alternately and repeatedly stacked. For example, the vertical magnetic structure may include, for example, at least one of (Co/Pt)n, (CoFe/Pt)n, (CoFe/Pd)n, (Co/Pd)n, (Co/Ni)n, (CoNi/Pt)n, (CoCr/Pt)n and (CoCr/Pd)n, where n is the number of stacks.). Here, the reference vertical pattern 130h may be thicker than the free vertical pattern 130, and a coercive force of the reference vertical pattern 130h may be greater than that of the free vertical pattern 130.

The tunnel barrier pattern 130i may include, for example, at least one of magnesium oxide, titanium oxide, aluminum oxide, magnesium zinc oxide, and magnesium boron oxide. The information storage unit 130 may include a lower electrode 130f and an upper electrode 130g. As shown, the reference vertical pattern 130h, the tunnel barrier pattern 130i and the free vertical pattern 130 may be sequentially stacked on the lower electrode 130f, and the upper electrode 130g may be stacked on the free vertical pattern 130. Alternatively, the free vertical pattern 130, the tunnel barrier pattern 130i and the reference vertical pattern 130h may be sequentially stacked on the lower electrode 130f, and the upper electrode 130g may be stacked on the reference vertical pattern 130h. The lower and upper electrodes 130f and 130g may be made of, for example, conductive metal nitride.

A method for fabricating a nonvolatile memory device according to an embodiment of the present inventive subject matter will be described with reference to FIGS. 4 to 11.

FIGS. 4 to 11 illustrate intermediate process steps for fabricating a nonvolatile memory device according to an embodiment of the present inventive subject matter.

Figure 4:
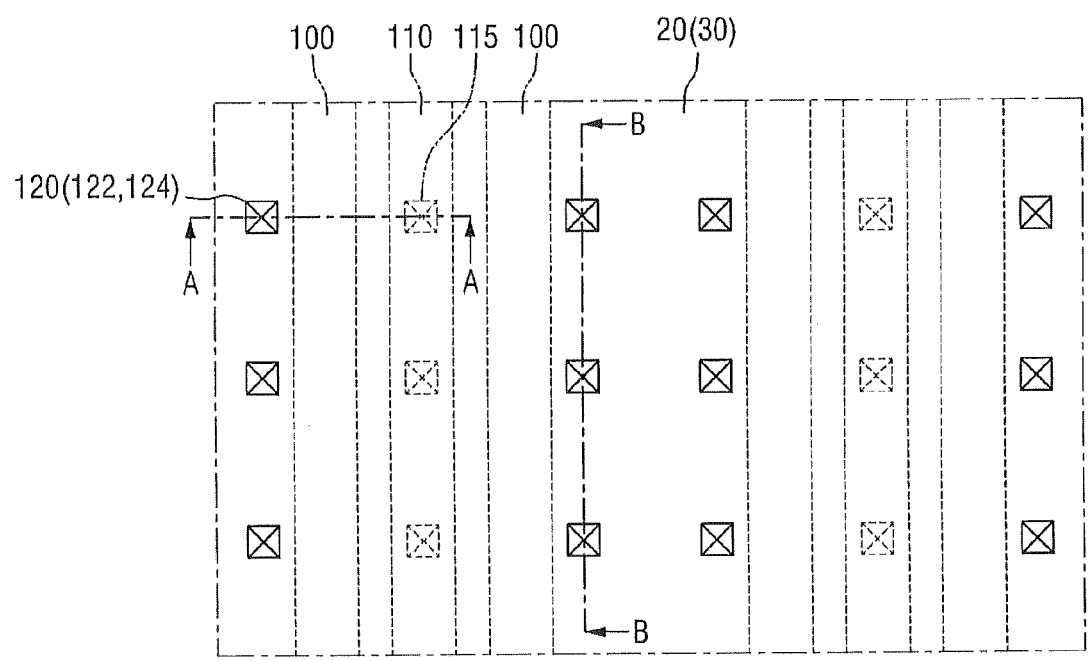
FIGS. 4 to 11 illustrate intermediate process steps of a method for fabricating a nonvolatile memory device according to an embodiment of the present inventive subject matter.
Figure 5:
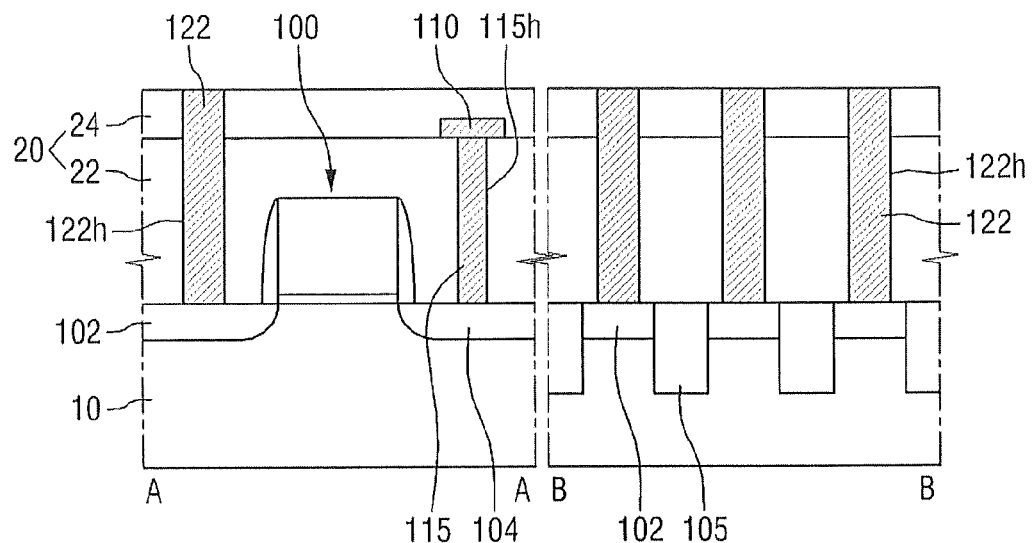
Figure 6:
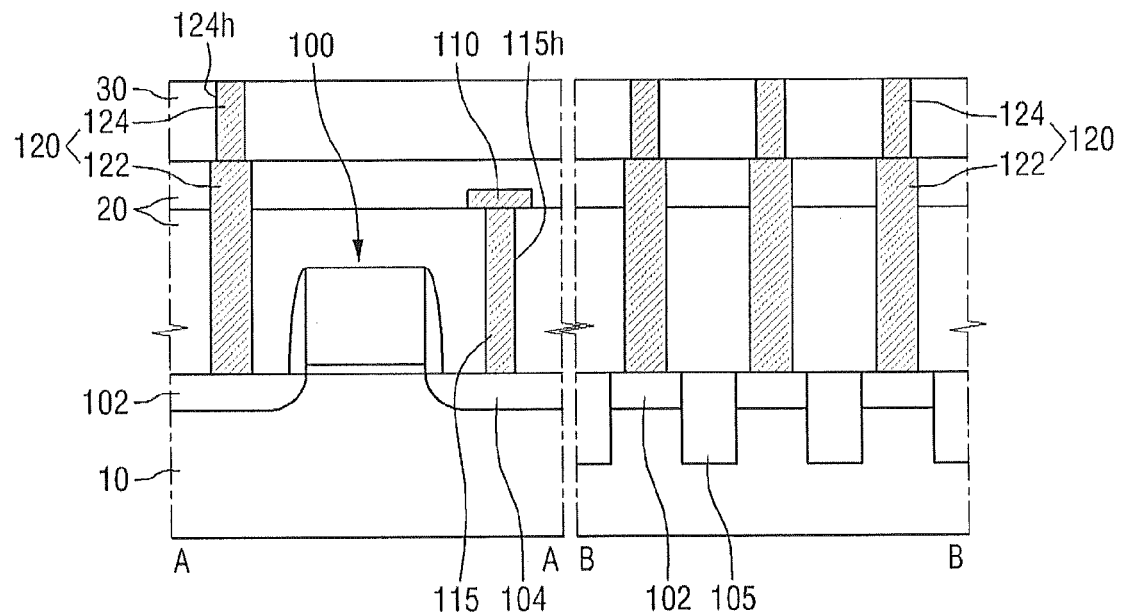
Figure 7:
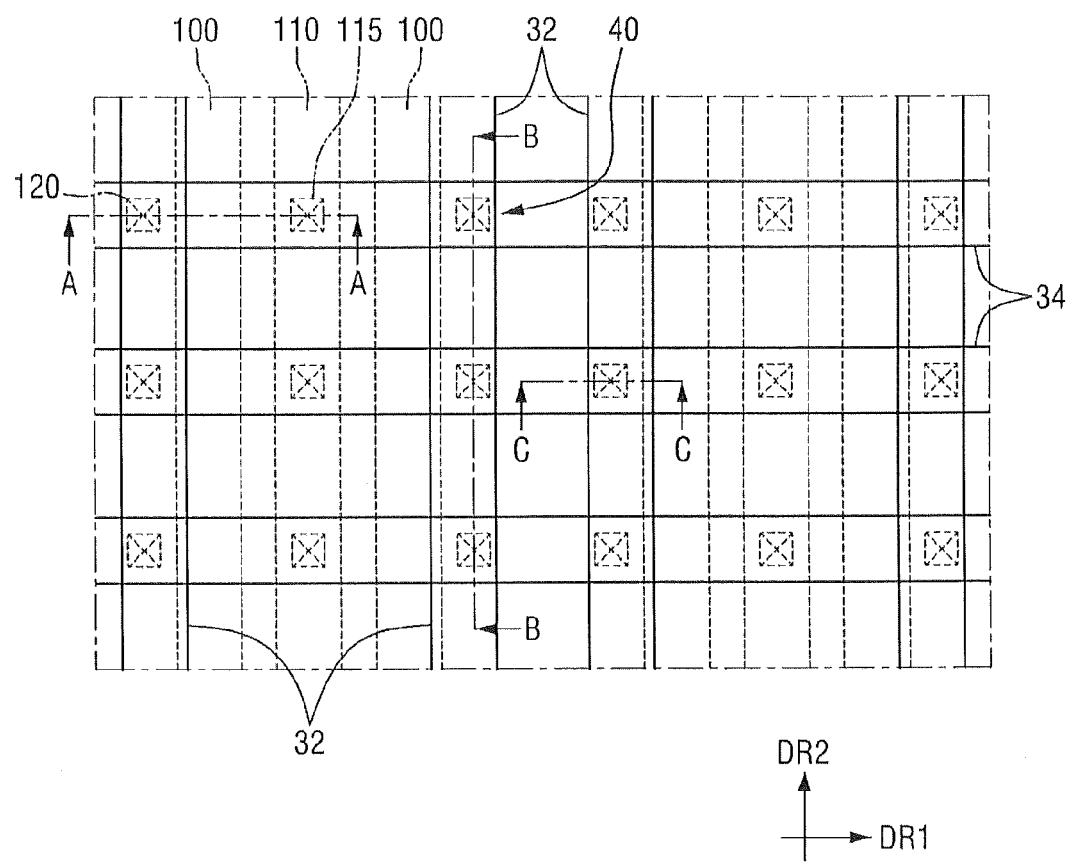
Figure 8:
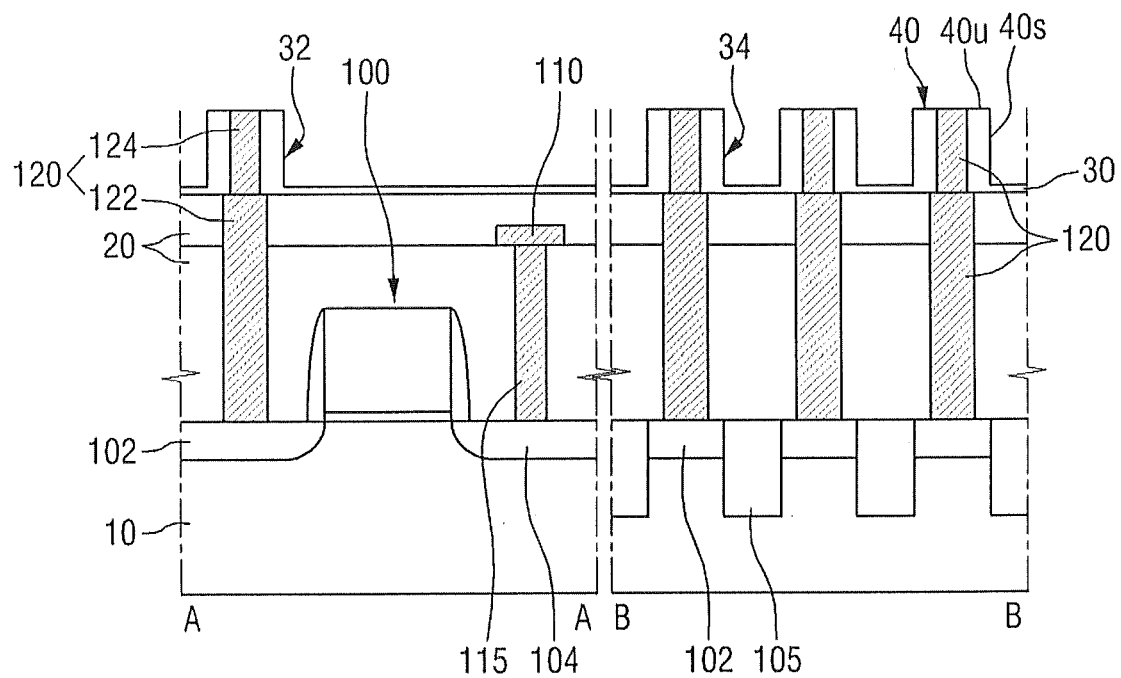
Figure 9A:
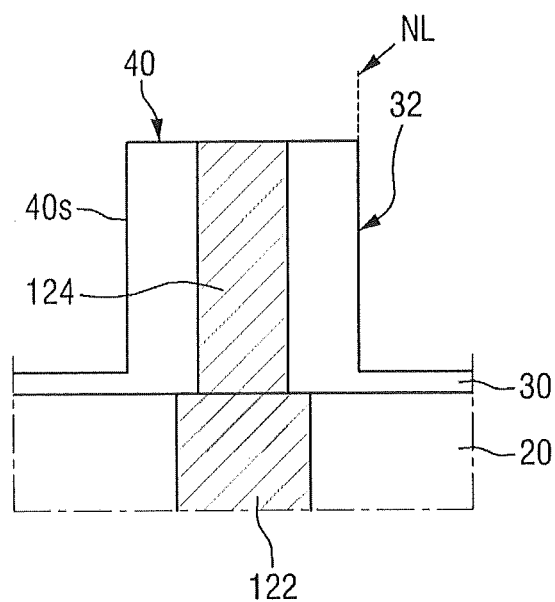
Figure 9B:
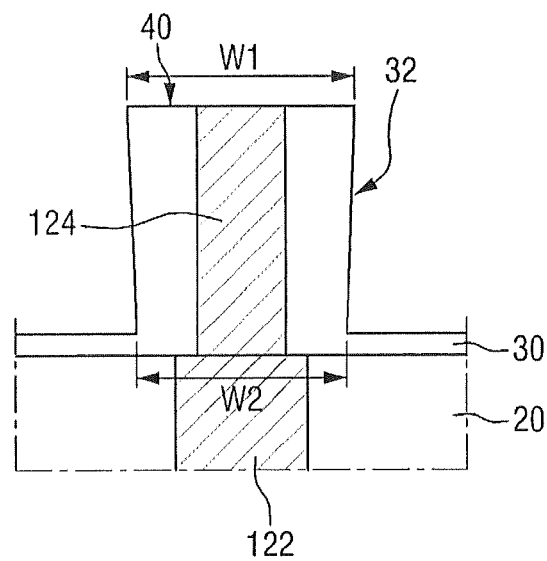

Specifically, FIGS. 5 and 6 are cross-sectional views of FIG. 4, taken along the lines A-A and B-B, FIG. 8 is a cross-sectional view of FIG. 7, taken along the lines A-A and B-B, and FIGS. 9A and 9B are cross-sectional views of FIG. 7, taken along the lines C-C.

Referring to FIGS. 4 and 5, a transistor 100 is formed on a substrate 10, the transistor 100 including a first impurity region 104 and a second impurity region 102 formed in the substrate 10. A first interlayer insulation layer 20 covering the transistor 100 is formed on the substrate 10 having the transistor 100.

A second contact 120 passing through the first interlayer insulation layer 20 is formed in the first interlayer insulation layer 20. The second contact 120 is electrically connected to the second impurity region 102. In detail, the second lower contact 122 passes through the first interlayer insulation layer 20 and is electrically connected to the second impurity region 102.

In detail, an isolation layer 105 is formed in the substrate 10 to define an active region. The isolation layer 105 may be, for example, a trench-type isolating pattern. The substrate 10 may include, for example, a semiconductor layer including silicon (Si), silicon germanium (SiGe) and/or silicon carbide (SiC), a conductive layer including titanium (Ti), titanium nitride (TiN), aluminum (Al), tantalum (Ta), tantalum nitride (TaN) and/or titanium aluminum nitride (TiAlN), and a dielectric layer including silicon oxide, titanium oxide, aluminum oxide, zirconium oxide and hafnium oxide. In addition, the substrate 10 may include an epitaxial layer, a silicon on insulator (SOI) layer and/or a semiconductor on insulator (SEOI) layer. In addition, the substrate 10 may include a conductive line or other semiconductor elements. The substrate 10 may be a substrate doped with a first impurity.

The transistor 100 may be formed on the substrate 10 having the active region defined thereon. The transistor 100 may include a first impurity region 104 and a second impurity region formed at opposite sides of a spacer of the transistor 100. The first impurity region 104 and the second impurity region 102 may be formed in the substrate 10. The first impurity region 104 is a region to which a first contact 115 shared by a neighboring transistor 100 is connected, and the second impurity region 102 is a region to which a second contact (120 of FIG. 10A) connected to each information storage unit (130 of FIG. 10A) is connected. The first and second impurity regions 102 and 104 may be formed by doping impurity of a conductivity type opposite to that of the substrate 10.

The transistor 100 is formed to extend in a second direction DR2 and may extend over a plurality of active regions separated from each other by the isolation layer 105. A gate electrode of the transistor 100 may include, for example, a doped semiconductor and/or a metal. A gate insulation layer of the transistor 100 may include, for example, silicon oxide, SiON, $Ge_xO_yN_z$, $Ge_xSi_yO_z$, a high-k material, or a combination thereof, or may have a stacked structure having layers made of these materials sequentially stacked. The spacer of the transistor 100 may include, for example, at least one of an oxide layer, an oxynitride layer and a nitride layer.

In the method of fabricating a nonvolatile memory device according to an embodiment of the present inventive subject matter, the transistor 100 may be a planar transistor, but not limited thereto. That is to say, the transistor 100 may have various structures, including a buried channel array transistor (BCAT), a vertical channel array transistor (VCAT) formed on a pillar-shaped unit active region, and other structures.

After the transistor 100 is formed, the first lower interlayer insulation layer 22 covering the transistor 100 may be formed on the substrate 10. The first lower interlayer insulation layer 22 may include, for example, at least one of an oxide layer, an oxynitride layer, and a nitride layer, and may be formed by chemical vapor deposition (CVD).

The first contact 115 formed in the first lower interlayer insulation layer 22 may be formed on the first impurity region 104 in a dot type to then be electrically connected to the first impurity region 104. The first contact 115 may be arranged in a second direction DR2. The first contact 115 may include, for example, at least one of a doped semiconductor, a metal, a conductive metal nitride, and a metal-semiconductor compound.

In the method of fabricating a nonvolatile memory device according to an embodiment of the present invention, the first contact 115 is formed in a dot type, but is not limited thereto. That is to say, the first contact 115 may be typed of a line connecting the first impurity region 104 in the second direction DR2.

The first contact 115 may be formed in the first contact hole 115h passing through the first lower interlayer insulation layer 22 and exposing the first impurity region 104. The first contact hole 115h may be formed by forming a mask pattern on the first lower interlayer insulation layer 22 and patterning the first lower interlayer insulation layer 22 using the mask pattern as an etch mask. The first contact 115 may be formed by filling the first contact hole 115h with a conductive material and planarizing the resultant product. As the result of the planarizing for forming the first contact 115, a top surface of the first lower interlayer insulation layer 22 may also be planarized.

The first wiring 110 is formed on the first lower interlayer insulation layer 22 and extends lengthwise in the second direction DR2. The first wiring 110 is electrically connected to the first impurity region 104 by the first contact 115 formed in the first lower interlayer insulation layer 22. The first wiring 110 may include, for example, at least one of a doped semiconductor, a metal, a conductive metal nitride, and a metal-semiconductor compound.

After forming the first wiring 110, a first upper interlayer insulation layer 24 covering the first lower interlayer insulation layer 22 and the first wiring 110 is formed on the substrate 10. The first upper interlayer insulation layer 24 may include, for example, at least one of an oxide layer, an oxynitride layer, and a nitride layer, and may be formed by chemical vapor deposition (CVD).

The second lower contact 122 may be formed in the first upper interlayer insulation layer 24 and the first lower interlayer insulation layer 22. That is to say, the second lower contact 122 may be formed in the first interlayer insulation layers 22 and 24 while passing through the first interlayer insulation layer 20. The second lower contact 122 is formed on the second impurity region 102 formed in the substrate 10 to then be electrically connected to the second impurity region 102. The second lower contact 122 may be arranged in the second direction DR2. The second lower contact 122 and the first contact 115 may be arranged in the first direction DR1. The second lower contact 122 may include, for example, at least one of a doped semiconductor, a metal, a conductive metal nitride, and a metal-semiconductor compound.

The second lower contact 122 may be formed in the second lower contact hole 122h passing through the first interlayer insulation layer 20 and exposing the second impurity region 102. The second lower contact hole 122h may be formed by forming a mask pattern on the first interlayer insulation layer 20 and patterning the first interlayer insulation layer 20 using the mask pattern as an etch mask. The second lower contact 122 may be formed by filling the second lower contact hole 122h with a conductive material and planarizing the resultant product.

In addition, a lower conductive pad may further be formed on the second lower contact 122, but aspects of the present inventive subject matter are not limited thereto. The lower conductive pad may be formed for the purpose of securing a contact margin in forming a second upper contact 124 in a later operation.

Referring to FIGS. 4 and 6, a second interlayer insulation layer 30 may be formed on the first interlayer insulation layer 20, and a second upper contact 124 may be formed in the second interlayer insulation layer 30. The second upper contact 124 may be formed to overlap the second lower contact 122.

The second upper contact 124 is electrically connected to the second lower contact 122 and is electrically connected to the second impurity region 102 by means of the second lower contact 122. The second upper contact 124 and the second lower contact 122 may be arranged in a line and formed on the second impurity region 102.

In detail, the second interlayer insulation layer 30 covering the second lower contact 122 may be formed on the first interlayer insulation layer 20. The second interlayer insulation layer 30 may include, for example, at least one of an oxide layer, an oxynitride layer, and a nitride layer, and may be formed by chemical vapor deposition (CVD).

Thereafter, the second upper contact 124 may be formed in the second interlayer insulation layer 30. That is to say, the second upper contact 124 may be formed while passing through the second interlayer insulation layer 30. The second upper contact 124 may include, for example, at least one of a doped semiconductor, a metal, a conductive metal nitride, and a metal-semiconductor compound.

The second upper contact 124 may be formed in the second upper contact hole 124h passing through the second interlayer insulation layer 30 and exposing the second lower contact 122. The second upper contact hole 124h may be formed by forming a mask pattern on the second interlayer insulation layer 30 and patterning the second interlayer insulation layer 30 using the mask pattern as an etch mask. The second upper contact 124 may be formed by filling the second upper contact hole 124h with a conductive material and planarizing the resultant product. As the result of the planarizing for forming the second upper contact 124, a top surface of the second interlayer insulation layer 30 may also be planarized.

The second upper contact 124 is formed in the second interlayer insulation layer 30, thereby forming the second contact 120 electrically connected to the second impurity region 102. The second contact 120 may be formed while passing through the second interlayer insulation layer 30 and the first interlayer insulation layer 20 through operations of forming contacts multiple times.

Referring to FIGS. 7 and 8, a first trench 32 and a second trench 34 are formed in the second interlayer insulation layer 30, thereby forming protrusions 40. In detail, the first trench 32 may extend in the second direction DR2 and may be formed in the second interlayer insulation layer 30. The second trench 34 may extend in the first direction DR1 and may be formed in the second interlayer insulation layer 30. Each of the protrusions 40 shaped of, for example, a square pillar, may be formed on portions of the second interlayer insulation layer 30, where the first trench 32 and the second trench 34 are not formed.

The second upper contact 124 remains in the protrusions 40 formed by the first trench 32 and the second trench 34. That is to say, the first trench 32 and the second trench 34 are formed at a region not overlapping the second upper contact 124 formed in the second interlayer insulation layer 30. Because the second upper contact 124 overlaps the underlying second impurity region 102, the protrusions 40 overlap the second impurity region 102 formed in the substrate 10.

In other words, the first and second interlayer insulation layers 20 and 30 are formed to cover the transistor 100. The first and second interlayer insulation layers 20 and 30 may include the protrusions 40 defined by the first trench 32 and the second trench 34. The protrusions 40 overlap the second impurity region 102. That is to say, the first and second interlayer insulation layers 20 and 30 covering the transistor 100 include the protrusions 40 overlapping the second impurity region 102.

A first trench 32 extending in the second direction DR2 is formed between neighboring second contacts 120 arranged in the first direction DR1. The first contact 115 disposed between the neighboring second contacts 120 overlaps a bottom surface of the first trench 32.

Because the protrusions 40 are formed by the first trench 32 and the second trench 34 crossing each other, one of opposed side surfaces 40s of the protrusions 40 may correspond to side surfaces of the first trench 32, the other of opposed side surfaces 40s of the protrusions 40 may correspond to side surfaces of the second trench 34. That is to say, as shown in FIG. 8, the side surfaces of the first trench 32 are shown from the cross-sectional view taken along the line A-A, and the side surfaces of the second trench 34 are shown from the cross-sectional view taken along the line B-B.

The top surface 40u of the protrusion 40 may be the same plane as the top surface of the second interlayer insulation layer 30 before the first trench 32 and the second trench 34 are formed. Therefore, the top surface 40u of the protrusion 40 exposes the second contact 120, specifically, the second upper contact 124.

In detail, a mask pattern covering the second contact 120 arranged in the second direction DR2 is formed to extend in the second direction DR2. At least a portion of the second interlayer insulation layer 30 is removed using the mask pattern as an etch mask. The first trench 32 extending lengthwise in the second direction DR2 is formed in the second interlayer insulation layer 30 by removing the at least a portion of the second interlayer insulation layer 30. Thereafter, a mask pattern covering the first contact 115 and the second contact 120 arranged in the first direction DR1 is formed to extend in the first direction DR1. At least a portion of the second interlayer insulation layer 30 is removed using the mask pattern as an etch mask. The second trench 34 extending lengthwise in the first direction DR1 is formed in the second interlayer insulation layer 30 by removing the at least a portion of the second interlayer insulation layer 30.

In addition, rectangular mask patterns covering the second contact 120 are formed to be spaced apart from each other in the first and second directions DR1 and DR2. The first trench 32 and the second trench 34 may be simultaneously formed by removing the at least a portion of the second interlayer insulation layer 30 using the mask patterns as etch masks.

The etching for forming the first trench 32 and the second trench 34 may include at least one of dry etching and wet etching.

In FIG. 8, a depth of each of the first trench 32 and the second trench 34 is less than a height of the second upper contact 124, but aspects of the present inventive subject matter are not limited thereto. That is to say, depths of the first trench 32 and/or the second trench 34 are equal to a thickness of the second interlayer insulation layer 30, so that the bottom surface of the first trench 32 and/or the second trench 34 may correspond to the top surface of the first interlayer insulation layer 20. In addition, the bottom surface of the first trench 32 and/or the second trench 34 is positioned in the first interlayer insulation layer 20, so that the depth of each of the first trench 32 and the second trench 34 may be greater than the height of the second upper contact 124.

Shapes of the protrusions 40 will now be described in detail with reference to FIGS. 7, 9A and 9B.

Referring to FIGS. 7 and 9A, the protrusion 40 may be shaped as a three-dimensional right prism.

It is assumed that the first interlayer insulation layer 20 is formed on the substrate 10 to have the same thickness. In this case, a normal line on the top surface of the substrate 10 is substantially parallel to a normal line NL on the top surface of the first interlayer insulation layer 20. Here, for the protrusion 40 to have the three-dimensional right prism shape, the side surfaces 40s of the protrusion 40 may be substantially parallel to the normal line NL on the top surface of the first interlayer insulation layer 20. The terms "the same thickness" used herein may mean that thicknesses at two locations compared are perfectly equal to each other and may include a negligible thickness difference due to a processing margin, for example.

In addition, because the protrusion 40 is formed by the first trench 32 and the second trench 34, it may have a three-dimensional right prism shape when the side surfaces 40s of the first trench 32 and the bottom surface of the first trench 32 meet at right angle.

Referring to FIGS. 7 and 9B, the protrusion 40 according to an embodiment of the present inventive subject matter may be shaped as an inverted quadrangular pyramid.

That is to say, a width of the top portion of the protrusion 40 is a first width W1, and a width of the bottom surface of the protrusion 40 is a second width W2. Because the width W1 of the top portion of the protrusion 40 is greater than the width W2 of the bottom surface of the protrusion 40, the protrusion 40 is shaped as an inverted quadrangular pyramid. In addition, the bottom portion of the protrusion 40 entirely overlaps the top portion of the protrusion 40. The width of the protrusion 40 may continuously decrease from the top portion to the bottom portion of the protrusion 40, but aspects of the present inventive subject matter are not limited thereto.

Figure 10A:
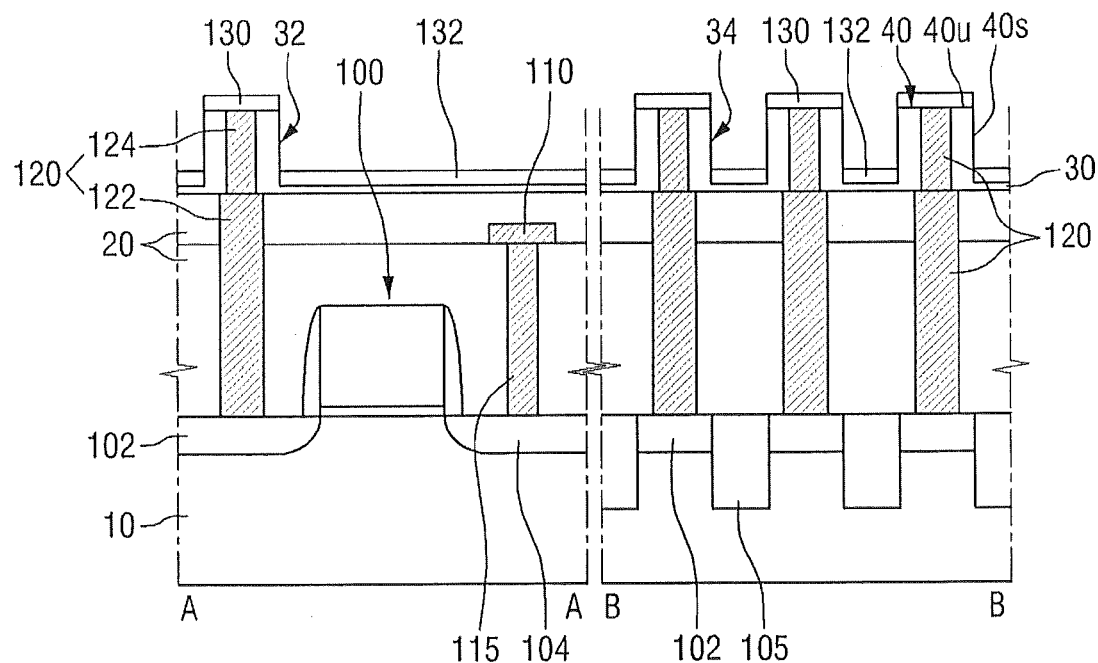
Figure 10B:
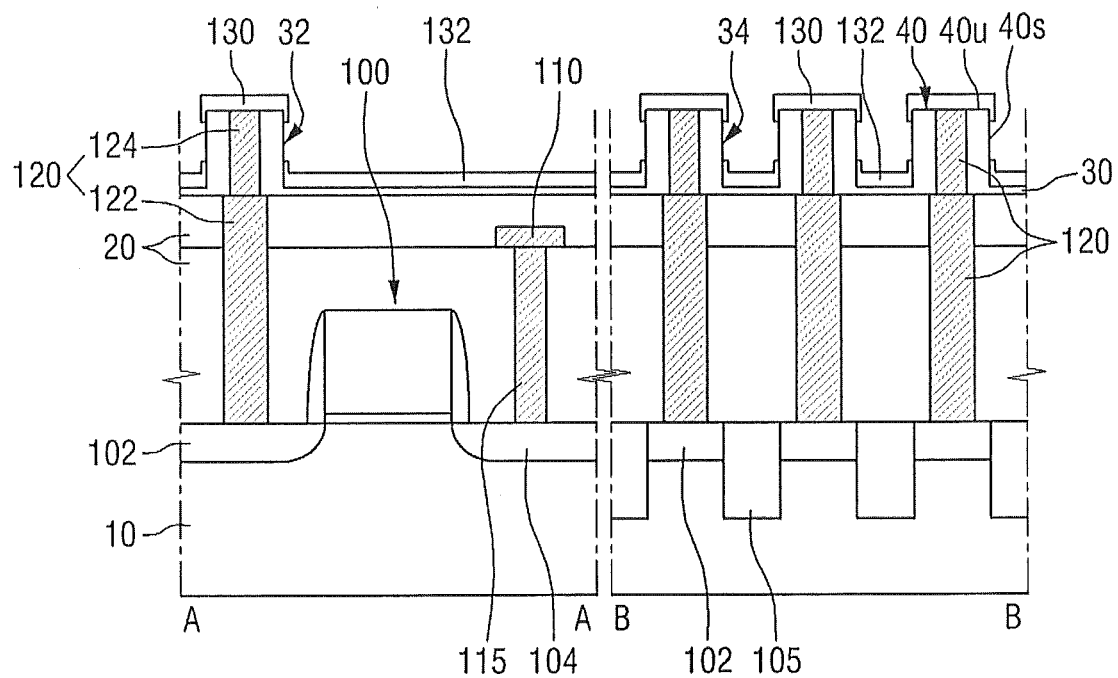

Referring to FIGS. 10A and 10B, an information storage unit 130 exposing the side surface 40s of the protrusion 40 is formed on the protrusion 40 using PCM-PVD. The information storage unit 130 formed on the protrusion 40 is electrically connected to the second upper contact 124 formed in the protrusion 40.

In other words, the information storage unit 130 is formed on the top surface 40u of the protrusion 40 defined by the first trench 32 and the second trench 34. That is to say, because the top surface 40u of the protrusion 40 corresponds to the top surface of the second interlayer insulation layer 30 before the first trench 32 and the second trench 34 are formed, the information storage unit 130 is formed on the top surface of the second interlayer insulation layer 30, which is not removed by the first trench 32 and the second trench 34.

Because the second upper contact 124 is electrically connected to the second lower contact 122, the information storage unit 130 is connected to the second lower contact 122 by means of the second upper contact 124. Further, the information storage unit 130 is electrically connected to the second impurity region 102.

Because the protrusion 40 is formed to overlap the second impurity region 102, the second impurity region 102, the second lower contact 122, the second upper contact 124 and the information storage unit 130 overlap one another and are arranged in a line.

A dummy information storage unit 132 is formed on bottom surfaces of the first trench 32 and the second trench 34. The dummy information storage unit 132 is formed at the same level as the information storage unit 130 formed on the protrusion 40. The term "the same level" used herein may mean that two elements compared are formed by the same manufacturing process. While the dummy information storage unit 132 surrounds the circumference of the information storage unit 130 formed on the protrusion 40, there is a step difference between the information storage unit 130 and the dummy information storage unit 132, so that the information storage unit 130 and the dummy information storage unit 132 are electrically disconnected from each other.

The information storage unit 130 formed on the protrusion 40 and exposing the side surface 40s of the protrusion 40 has the same structure as described above with reference to FIGS. 3A and 3B, and a repeated description of the information storage unit 130 will be omitted.

Referring to FIG. 10A, the information storage unit 130 is formed on the top surface 40u of the protrusion 40 but is not formed on the side surface 40s of the protrusion 40. That is to say, the information storage unit 130 is not formed on the side surfaces of the first trench 32 and the second trench 34.

Processing conditions of the PCM-PVD used in forming the information storage unit 130, thereby forming the information storage unit 130 on the top surface 40u of the protrusion 40 while not forming the information storage unit 130 on the side surface 40s of the protrusion 40, which will later be described in detail with reference to FIGS. 16 to 18.

Referring to FIG. 10B, the information storage unit 130 is formed on a portion of the side surface 40s of the protrusion 40 as well as on the top surface 40u of the protrusion 40. That is to say, the information storage unit 130 covers portions of the upper side surfaces of the first trench 32 and the second trench 34.

In detail, while a pre-information storage unit is formed on the second interlayer insulation layer 30 including the protrusion 40. A thickness of the pre-information storage unit formed on the top surface 40u of the protrusion 40 is greater than that of the pre-information storage unit formed on the side surface 40s of the protrusion 40, the pre-information storage unit may also be formed on the side surface 40s of the protrusion 40 according to the processing condition.

After forming the pre-information storage unit, at least a portion of the pre-information storage unit formed on the side surface 40s of the protrusion 40 is removed, thereby exposing the side surface 40s of the protrusion 40. In such a manner, the information storage unit 130 exposing the side surface 40s of the protrusion 40 may be formed on the protrusion 40. Nodes of the information storage unit 130 and the dummy information storage unit 132 are separated from each other by removing the at least a portion of the pre-information storage unit formed on the side surface 40s of the protrusion 40.

The removing of the pre-information storage unit formed on the side surface 40s of the protrusion 40 may include performing an etching process using particles incident into the top surface 40u of the protrusion 40 with a tilt angle. For example, the removing of the pre-information storage unit formed on the side surface 40s of the protrusion 40 may be performed by etching using ion beam. When the pre-information storage unit formed on the side surface 40s of the protrusion 40 is removed, the upper electrode described with reference to FIGS. 3A and 3B may be used as an etch mask, and a portion of the upper electrode may be removed by a sacrificial layer.

In the PCM-PVD used in forming the information storage unit 130, a thickness of a layer formed on the top surface 40u of the protrusion 40 is greater than that of a layer formed on the side surface 40s of the protrusion 40. However, when the information storage unit 130 is formed using the PCM-PVD, it may also be formed on the side surface 40s of the protrusion 40. Thus, the information storage unit formed on the side surface 40s of the protrusion 40 is removed for node separation.

Hereinafter, the PCM-PVD used in forming the information storage unit 130 and experimental data carried out using the PCM-PVD will be described.

Figure 16:
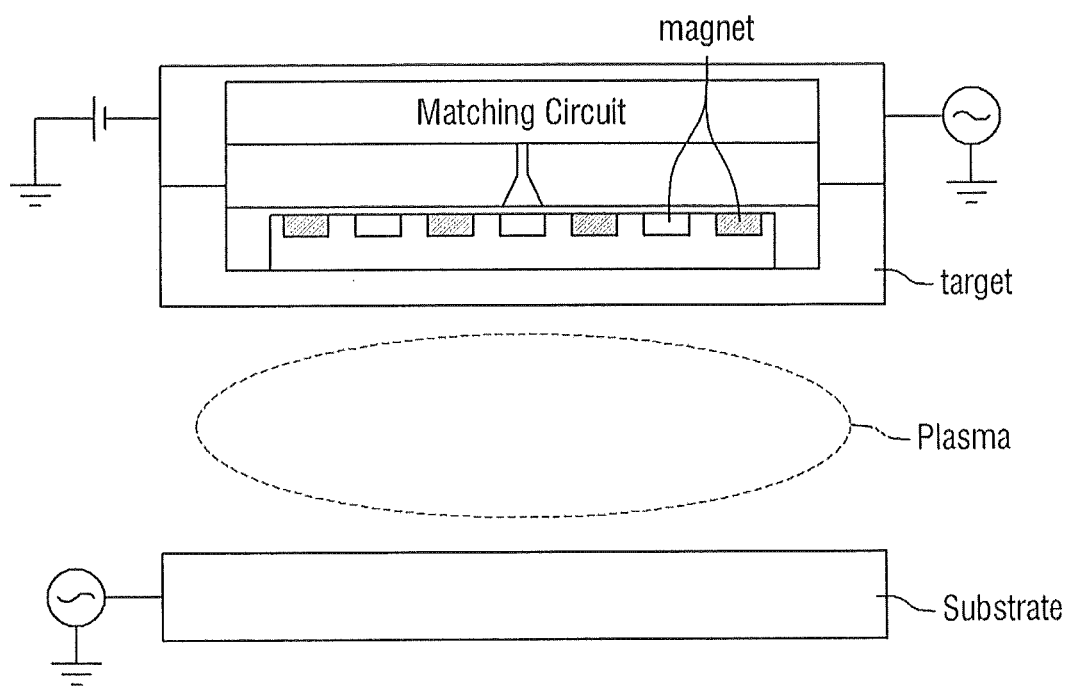
FIG. 16 is a schematic view illustrating a point cusp magnetron-physical vapor deposition (PCM-PVD) used in the method for fabricating a nonvolatile memory device according to embodiments of the present inventive subject matter.
Figure 17:
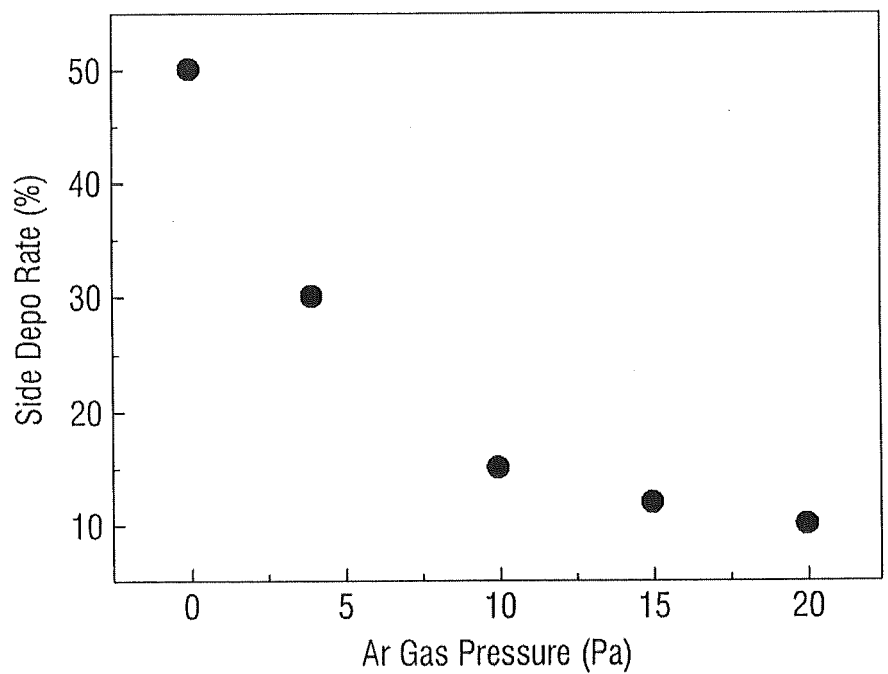
FIGS. 17 and 18 are graphs of experimental data obtained by depositing an information storage unit using the PCM-PVD shown in FIG. 16.
Figure 18:
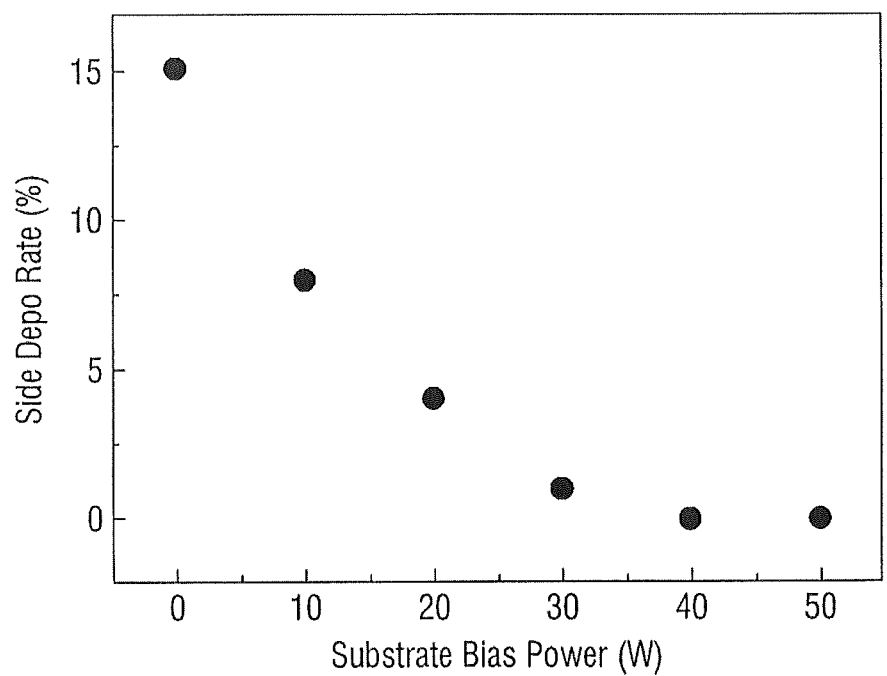

FIG. 16 is a schematic view illustrating a point cusp magnetron-physical vapor deposition (PCM-PVD) used in the method for fabricating a nonvolatile memory device according to embodiments of the present inventive subject matter, and FIGS. 17 and 18 illustrate experimental data obtained by depositing an information storage unit using the PCM-PVD shown in FIG. 16.

Referring to FIG. 16, at the same time when plasma is generated by applying RF current to a target, a point-cusp magnetic field is formed from magnets arranged on the target, thereby generating high-density plasma using PCM-PVD.

The point-cusp magnetic field is formed through arrangement of magnets disposed on the target. That is to say, neighboring magnets are arranged to have opposite polarities and all of the magnets are arranged at equal intervals. Such magnet arrangement forms a strong magnetic field, but a surface of a substrate is not affected by the point-cusp magnetic field. Thus, in a case of PCM-PVD, the substrate may be less damaged by plasma.

When a thin film is deposited using PCM-PVD, processing parameters may include, for example, RF power (W) of a target side for generating plasma, argon (Ar) gas pressure (Pa) for generating plasma through excitation, substrate bias power (W), and other parameters.

Referring to FIGS. 17 and 18, experimental data were obtained by conducting experiments after the target RF power was fixed to a constant value.

FIG. 17 is a graph illustrating experimental data of side deposition rate (%) depending on the partial pressure of argon (Ar) gas used as a plasma source.

Referring to FIG. 17, as the partial pressure of argon (Ar) gas increases from 0 to 20 Pa, the side deposition rate is gradually reduced. The term "side deposition rate" used herein may mean a value obtained by dividing a thickness of a thin film deposited on a side surface of a protruding structure having a rectangular cross section by a thickness of a thin film deposited on a top surface of the protruding structure and multiplying by 100.

If the partial pressure of argon (Ar) gas increases, secondary electrons emitted from the target may contribute to an increased plasma density. In such a manner, if the plasma density in the PCM-PVD increases, the side deposition rate is reduced.

Under a deposition pressure having the partial pressure of argon (Ar) gas ranging from 10 Pa to 20 Pa, the side deposition rate is reduced to 15% or less. If the side deposition rate is reduced, the etching process for node separation may be performed, as described above with reference to FIG. 10B.

FIG. 18 is a graph illustrating experimental data of side deposition rate (%) depending on the substrate bias power. Referring to FIG. 18, the experimental data were obtained by conducting experiments after the partial pressure of argon (Ar) gas used as a plasma source was fixed to 10 Pa.

Referring to FIG. 18, as the substrate bias power increases from 0 to 50 W, the side deposition rate is gradually reduced. That is to say, as the substrate bias power increases from 0 to 50 W, the side deposition rate is reduced from 15% to 0%.

In detail, if the substrate bias power is between 20 W and 50 W, the side deposition rate is reduced to 5% or less, and if the substrate bias power is greater than or equal to 30 W, the side deposition rate approaches nearly 0%. That is to say, the thin film is formed only on the top surface of the protruding structure while not being formed on lateral surfaces of the protruding structure.

Such experimental data may be attributable to increased straightness of a material emitted from the target to be deposited when the bias power applied to the substrate increases.

In addition, as confirmed from the experimental data shown in FIG. 17, when the partial pressure of argon (Ar) gas increased from about 10 Pa to about 20 Pa, the side deposition rate approaches nearly 0% even with a small amount of the bias power applied to the substrate.

In the method for fabricating a nonvolatile memory device according to the embodiment of the present inventive subject matter, the information storage unit 130 may be formed under a deposition pressure having the partial pressure of argon (Ar) gas ranging from about 10 Pa to about 20 Pa. In addition, the information storage unit 130 may be formed by applying bias power of about a 10 to about 50 W to the substrate.

Figure 11:
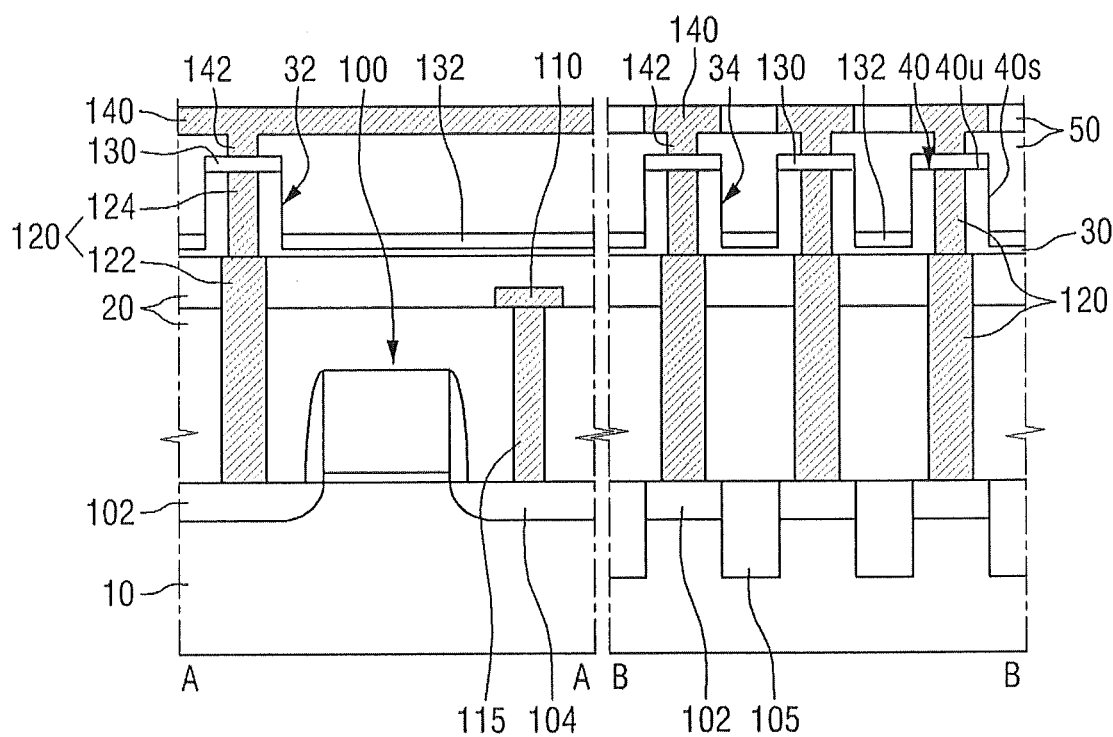

Referring to FIG. 11, a third interlayer insulation layer 50 covering the information storage unit 130 and the dummy information storage unit 132 is formed. After forming the third interlayer insulation layer 50, a second wiring 140 electrically connected to the information storage unit 130 is formed. The second wiring 140 may be electrically connected to the information storage unit 130 by a second wiring plug 142, but aspects of the present inventive subject matter are not limited thereto. In FIG. 2, the second wiring 140 may be formed to extend lengthwise in the first direction DR1 to then be electrically connected to the information storage unit 130 arranged in the first direction DR1.

The third interlayer insulation layer 50 may include, for example, at least one of an oxide layer, an oxynitride layer, and a nitride layer, and may be formed by chemical vapor deposition (CVD). The second wiring 140 and the second wiring plug 142 may include, for example, at least one of a metal and a conductive metal nitride. In detail, the second wiring 140 and the second wiring plug 142 may include copper (Cu).

In the method of fabricating a nonvolatile memory device according to an embodiment of the present inventive subject matter, the second wiring 140 is electrically connected to the information storage unit 130 by means of the second wiring plug 142, but aspects of the present inventive subject matter are not limited thereto. That is to say, the second wiring 140 may be directly electrically connected to the information storage unit 130 without the second wiring plug 142.

Next, a method for fabricating a nonvolatile memory device according to another embodiment of the present inventive subject matter will be described with reference to FIGS. 7 and 10A to 13.

Figure 12:
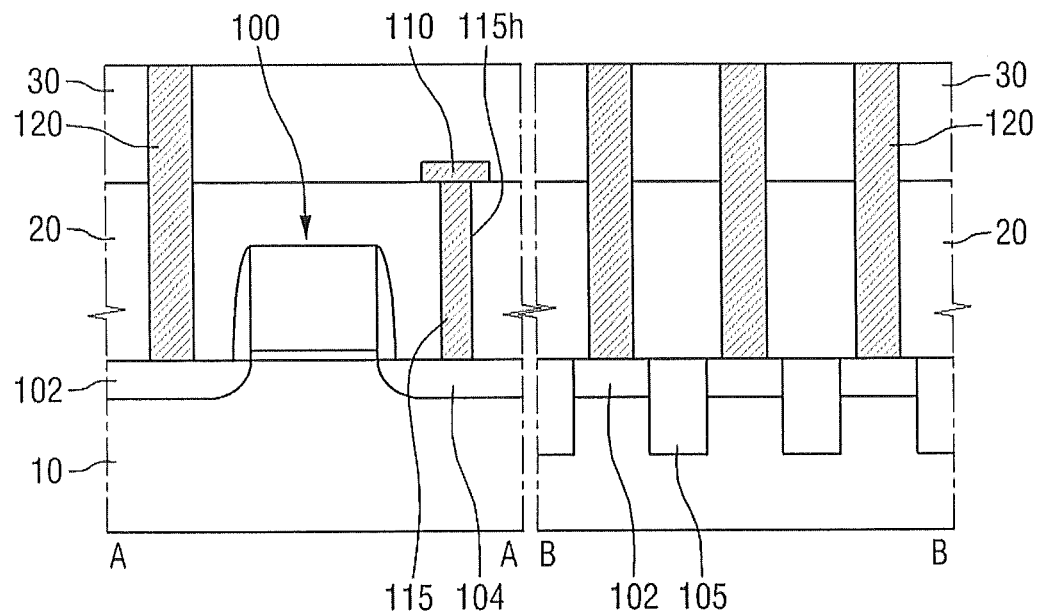
FIGS. 12 and 13 illustrate intermediate process steps of a method for fabricating a nonvolatile memory device according to another embodiment of the present inventive subject matter.
Figure 13:
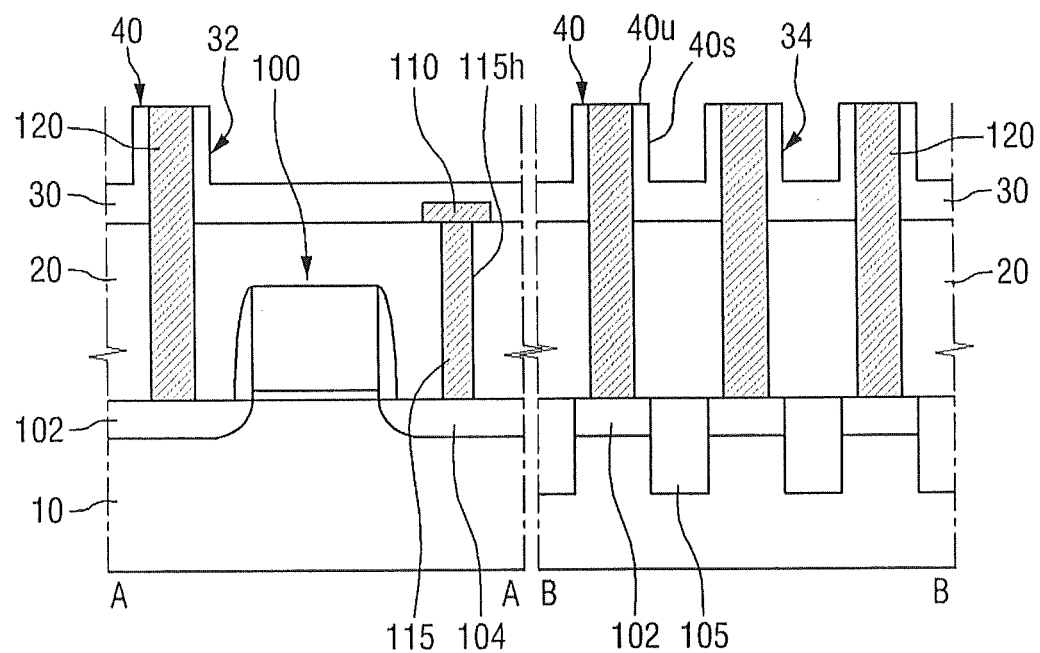

FIGS. 12 and 13 illustrate intermediate process steps for fabricating a nonvolatile memory device according to another embodiment of the present inventive subject matter.

Referring to FIG. 12, a transistor 100 is formed on a substrate 10, the transistor 100 including a first impurity region 104 and a second impurity region 102 formed in the substrate 10. After forming the transistor 100, a first interlayer insulation layer 20 and a second interlayer insulation layer 30 covering the transistor 100 are formed. A second contact 120 is formed in the first interlayer insulation layer 20 and the second interlayer insulation layer 30. The second contact 120 is electrically connected to the second impurity region 102.

In detail, after forming the transistor 100, the first interlayer insulation layer 20 covering the transistor 100 may be formed on the substrate 10. A first contact 115 electrically connected to the first impurity region 104 is formed in the first interlayer insulation layer 20. In addition, a first wiring 110 electrically connected to the first contact 115 and extending in the second direction DR2 is formed on the first interlayer insulation layer 20. Thereafter, a second interlayer insulation layer 30 covering the first wiring 110 is formed on the first interlayer insulation layer 20.

The second contact 120 is formed in the first interlayer insulation layer 20 and the second interlayer insulation layer 30. That is to say, the second contact 120 may be formed such that it continuously passes through the first interlayer insulation layer 20 and the second interlayer insulation layer 30. The second contact 120 is formed on the second impurity region 102 formed in the substrate 10 to be electrically connected to the second impurity region 102. The second contact 120 may include, for example, at least one of a doped semiconductor, a metal, a conductive metal nitride, and a metal-semiconductor compound.

The second contact 120 may be formed in a second contact hole 120h such that it continuously passes through the second interlayer insulation layer 30 and the first interlayer insulation layer 20 to expose the second impurity region 102. The second contact hole 120h may be formed by forming a mask pattern on the second interlayer insulation layer 30 and patterning the first interlayer insulation layer 20 and the second interlayer insulation layer 30 using the mask pattern as an etch mask. The second contact 120 may be formed by filling the second contact hole 120h with a conductive material and planarizing the resultant product.

Referring to FIGS. 7 and 13, a first trench 32 and a second trench 34 are formed in the second interlayer insulation layer 30, thereby forming protrusions 40. In detail, the first trench 32 may extend in a second direction DR2 to then be formed in the second interlayer insulation layer 30. The second trench 34 may extend in a first direction DR1 to then be formed in the second interlayer insulation layer 30. The protrusions 40 shaped of for example, a square pillar defined by the first trench 32 and the second trench 34, may be formed in the second interlayer insulation layer 30.

The first trench 32 extending in the second direction DR2 is formed between neighboring second contacts 120 arranged in the first direction DR1. The first contact 115 disposed between the neighboring second contacts 120 overlaps a bottom surface of the first trench 32.

Because the first wiring 110 covered by the second interlayer insulation layer 30 may not be exposed by the first trench 32, a depth of the first trench 32 is less than a thickness of the second interlayer insulation layer 30.

Thereafter, referring to FIGS. 10A to 11, an information storage unit 130 is formed on a top surface 40u of the protrusion 40, and a second wiring 140 electrically connected to the information storage unit 130 is then formed.

In the method of fabricating a nonvolatile memory device according to an embodiment of the present inventive subject matter, the information storage unit 130 includes lower electrodes 130a and 130f shown in FIGS. 3A and 3B, but aspects of the present inventive subject matter are not limited thereto. That is to say, referring to FIGS. 6 and 12, after forming the second contact 120, a lower electrode layer may be formed on the second interlayer insulation layer 30. In such a case, in the course of forming the first trench 32 and the second trench 34 to define the protrusion 40, the lower electrode layer may also be patterned. The patterned lower electrode layer remains on the top surface 40u of the protrusion 40. The lower electrode layer remaining on the top surface 40u of the protrusion 40 becomes lower electrodes 130a and 130f. An information storage unit 130 to later be formed may be formed by sequentially stacking reference patterns 130c and 130h, tunnel barrier patterns 130d and 130i, free patterns 130e and 130j and upper electrodes 130b and 130g, except for the lower electrodes 130a and 130f.

The nonvolatile memory device fabricated according to embodiments of the present invention may be implemented as various semiconductor packages. For example, the nonvolatile memory device according to embodiments of the present inventive subject matter may be mounted in various packages, such as PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 14:
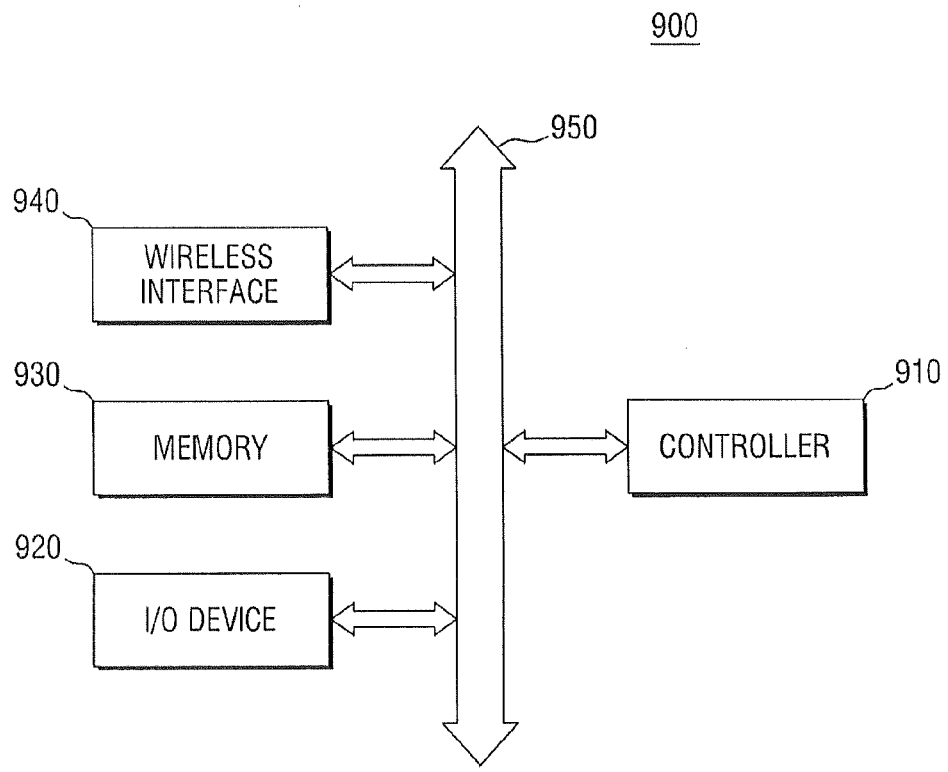
FIG. 14 is a schematic block diagram illustrating a system including a nonvolatile memory device fabricated according to embodiments of the present inventive subject matter.

FIG. 14 is a schematic block diagram illustrating a system including a nonvolatile memory device fabricated according to embodiments of the present inventive subject matter.

Referring to FIG. 14, the system 900 according to an embodiment of the present inventive subject matter may be applied to a wireless communication device, for example, a personal digital assistant (PDA), a laptop computer, a portable computer, a web tablet, a wireless phone, a mobile phone, a digital music player, or all devices capable of transmitting and/or receiving information under wireless environments.

The system 900 may include a controller 910, an input/output (I/O) device such as a key pad, a key board, or a display, a memory 930, and a wireless interface 940, which are connected to each other through a bus. The controller 910 may include, for example, at least one of a microprocessor, a digital signal processor, and the like. The memory 930 may store data and/or commands (or user data) processed by the controller 910, for example. The memory 930 may include nonvolatile memories according to various embodiments of the present invention. The memory 930 may further include different types of memories, a volatile memory accessible at an arbitrary time, and other kinds of memories.

The system 900 may use a wireless interface 940 to transmit data to a wireless communication network or receive data from the communication network. For example, the wireless interface 940 may include an antenna or a wireless transceiver.

The system 900 according to an embodiment of the present inventive subject matter may be used in a communication interface protocol for a next-generation communication system, such as Code Division Multiple Access (CDMA), Global System for Mobile Communication (GSM), North American Digital Cellular (NADC), Time Division Multiple Access (TDMA), Extended Time Division Multiple Access (E-TDMA), Wideband Code Division Multiple Access (WCDMA), or Code Division Multiple Access 2000 (CDMA2000). The nonvolatile memory device fabricated according to an embodiment of the present inventive subject matter may be applied to a memory card to be described later with reference to FIG. 15.

Figure 15:
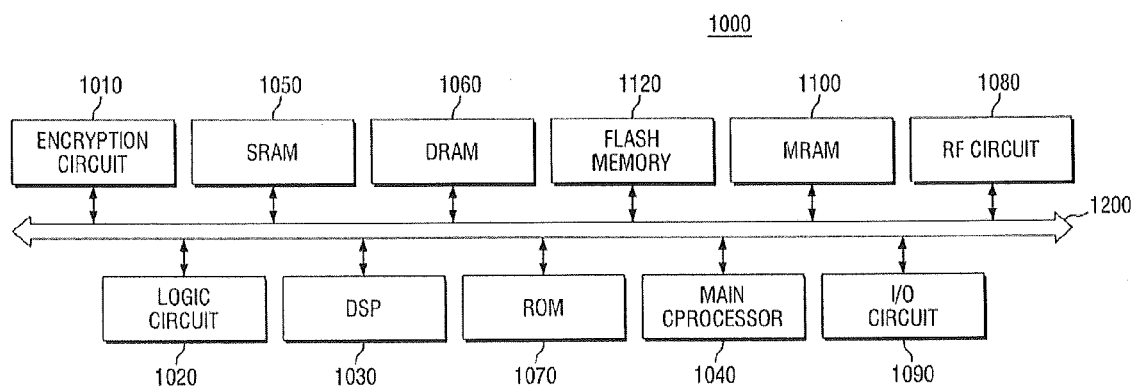
FIG. 15 is a schematic block diagram illustrating a memory card to which the nonvolatile memory device fabricated according to embodiments of the present invention is applied.

FIG. 15 is a schematic block diagram illustrating a memory card to which a nonvolatile memory device fabricated according to embodiments of the present inventive subject matter is applied.

Referring to FIG. 15, the memory card 1000 according to an embodiment of the present inventive subject matter may include an encryption circuit 1010, a logic circuit 1020, a digital signal processor (DSP) 1030, which is a dedicated processor, and a main processor 1040. In addition, the memory card 1000 may include a nonvolatile memory device 1100 according to various embodiments of the present inventive subject matter, and other various types of memories including, for example, SRAM 1050, DRAM 1060, ROM 1070, a flash memory 1120, and other memories.

The memory card 1000 may include an RF (high frequency wave/microwave) circuit 1080 and an input/output circuit 1090. Various functional blocks 1010-1120 provided in the memory card 1000 may be connected to each other through a system bus 1200. The memory card 1000 operates under the control of an external host. The nonvolatile memory device 1100 according to an embodiment of the present inventive subject matter may store data or may output stored data under the control of the host.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a nonvolatile memory device, comprising:
   forming a transistor on a substrate, the transistor including an impurity region formed in the substrate;
   forming a lower contact electrically connected to the impurity region;
   forming a first interlayer insulation layer on the lower contact;
   forming a first trench and a second trench in the first interlayer insulation layer, the first trench extending in a first direction and the second trench extending in a second direction different from the first direction; and
   forming an information storage unit electrically connected to the lower contact on a top surface of the first interlayer insulation layer using point cusp magnetron-physical vapor deposition (PCM-PVD); and
   forming a dummy information storage unit on bottom surfaces of the first and second trenches;
   wherein the information storage unit is not connected to the dummy information storage unit.

2. The method of claim 1, wherein the forming of the information storage unit comprises forming the information storage unit by applying bias power of about 10 to about 50 W (watt) to the substrate.

3. The method of claim 2, wherein the forming of the information storage unit comprises forming the information storage unit under a deposition pressure having a partial pressure of argon (Ar) gas ranging from about 10 Pa to about 20 Pa.

4. The method of claim 2, wherein the forming of the information storage unit comprises forming the information storage unit on the top surface of the first interlayer insulation layer while not forming the information storage unit on side surfaces of the first and second trenches.

5. The method of claim 1, before the forming of the first trench and the second trench, further comprising forming an upper contact in the first interlayer insulation layer, wherein the information storage unit is electrically connected to the lower contact by means of the upper contact.

6. A method of fabricating a nonvolatile memory device, comprising:
   forming a transistor on a substrate, the transistor including an impurity region formed in the substrate;
   forming a first interlayer insulation layer covering the transistor, the first interlayer insulation layer having a protrusion overlapping the impurity region such that the first interlayer insulation layer is nonplanar; and
   forming an information storage unit on the protrusion using point cusp magnetron-physical vapor deposition (PCM-PVD).

7. The method of claim 6, wherein the forming the information storage unit comprises forming the information storage unit while exposing side surfaces of the protrusion.

8. The method of claim 6, wherein the information storage unit is electrically connected to the impurity region.

9. The method of claim 8, further comprising:
   forming a lower contact electrically connected to the impurity region;
   forming an upper contact in the first interlayer insulation layer on the lower contact; and
   forming the information storage unit on the upper contact.

10. The method of claim 6, wherein a width of a top portion of the protrusion is greater than a width of a bottom portion of the protrusion, and the bottom portion of the protrusion entirely overlaps the top portion of the protrusion.

* * * * *